United States Patent [19]
Kobayashi et al.

[11] Patent Number: 6,014,339
[45] Date of Patent: Jan. 11, 2000

[54] SYNCHRONOUS DRAM WHOSE POWER CONSUMPTION IS MINIMIZED

[75] Inventors: Hiroyuki Kobayashi; Tatsuya Kanda, both of Kawasaki, Japan

[73] Assignee: Fujitsu Limited, Kanagawa, Japan

[21] Appl. No.: 08/920,888

[22] Filed: Aug. 29, 1997

[30] Foreign Application Priority Data

Apr. 3, 1997 [JP] Japan .................................. 9-085284

[51] Int. Cl.[7] ..................................................... G11C 8/00
[52] U.S. Cl. ............................................ 365/233; 365/191
[58] Field of Search ...................................... 365/233, 191

[56] References Cited

U.S. PATENT DOCUMENTS 5,384,737  1/1995  Childs et al. ....................... 365/189.05
5,550,781  8/1996  Takai ..................................... 365/233

Primary Examiner—David Nelms
Assistant Examiner—Hoai V. Ho
Attorney, Agent, or Firm—Nikaido Marmelstein Murray & Oram LLP

[57] ABSTRACT

An SDRAM that can operate quickly and requires a small amount of power. The SDRAM is a synchronous DRAM operating synchronously with an externally-input clock and has a clock buffer for generating an operation clock using the external clock, a plurality of pipelines, and gates interposed among the pipelines, operating according to the operation clock so as to restrict the timing of inputting an output of a previous stage to a subsequent stage. The synchronous DRAM, in which at least part of operations to be carried out consecutively are pipelined, further has an operation command judgment circuit for determining from the operating state of the synchronous DRAM whether or not the pipelines should be operated, and gate control circuits for giving control so that only when the operation command judgment circuit determines that the pipelines should be operated, is the operation clock supplied to the gates.

6 Claims, 10 Drawing Sheets

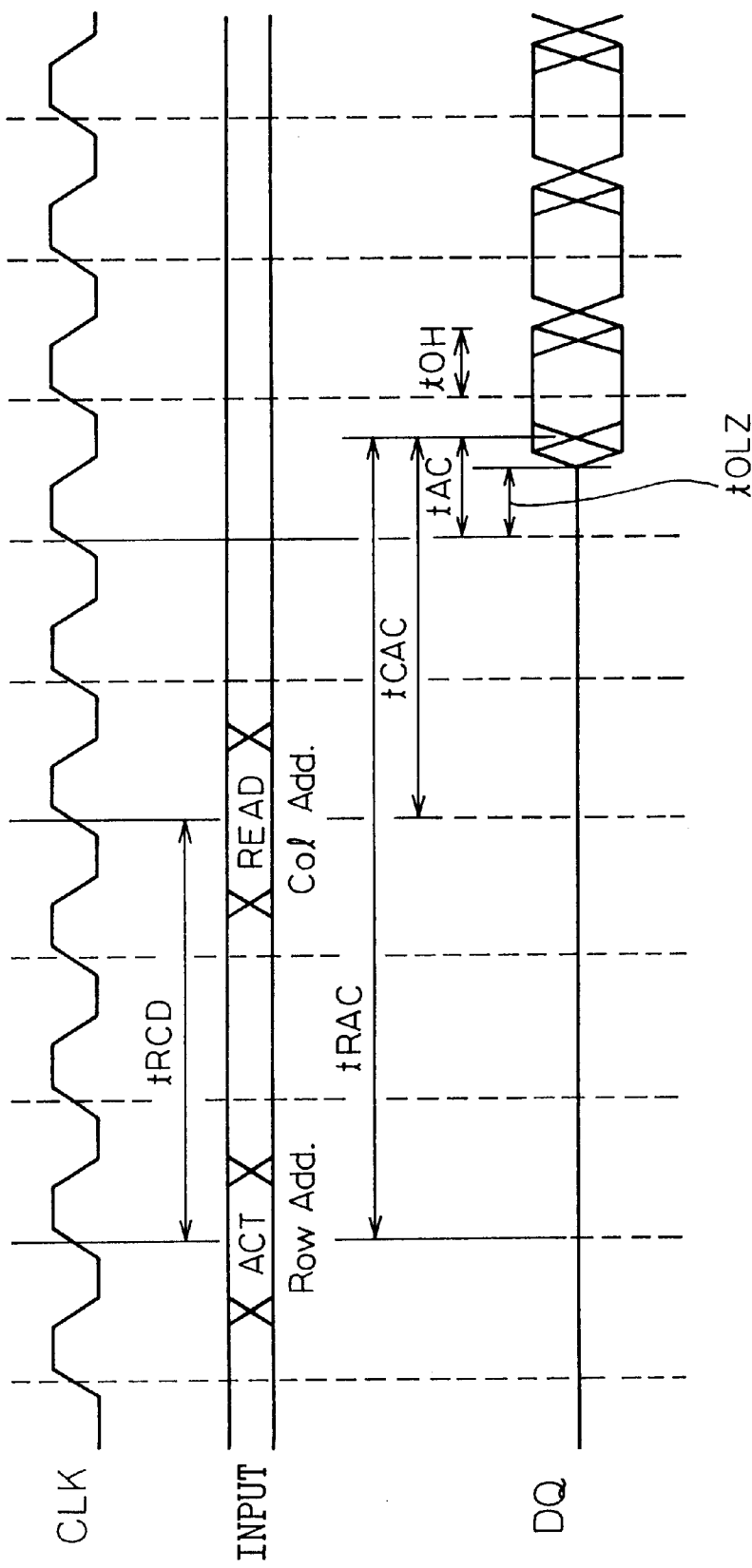

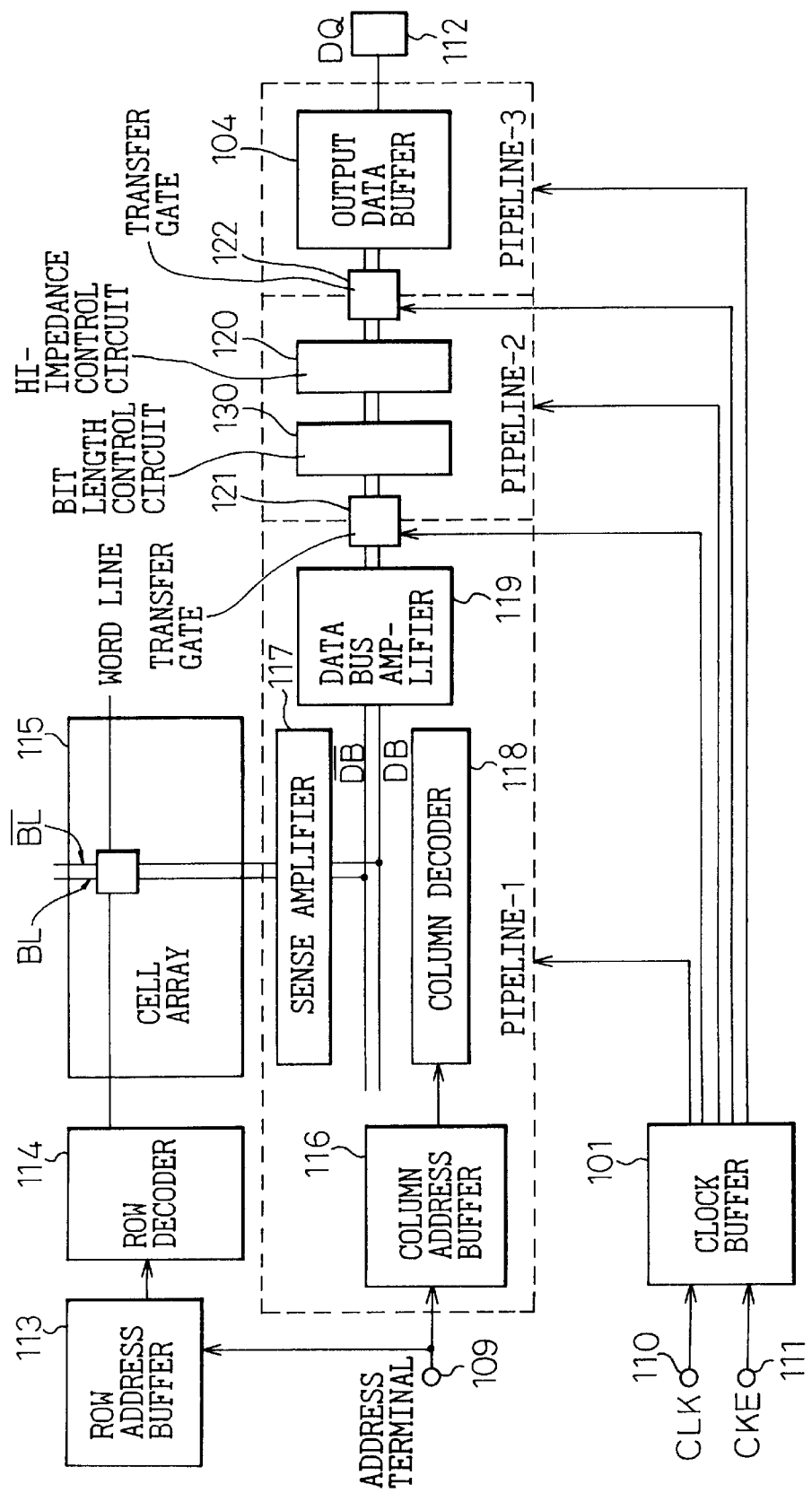

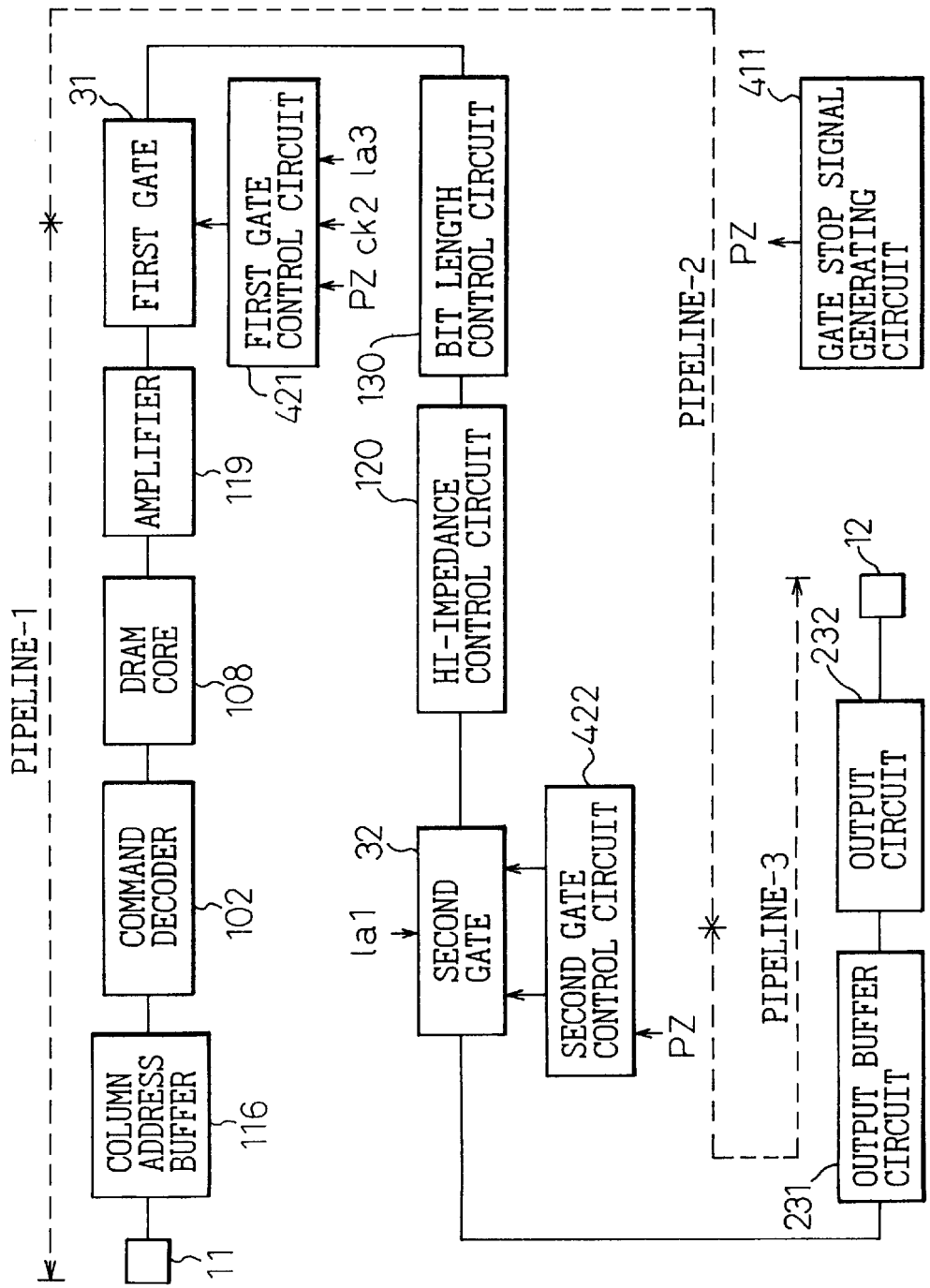

Fig.11

| STATE | la1 | la2 | la3 | PZ | cka | ckb | ckc | |
|---|---|---|---|---|---|---|---|---|
| 1 | H | L | L | H | H | L | H | ALL GATES ARE OPEN |
| 2 | L | H | L | H | H | EN | EN | FIRST GATE IS OPEN |
| 3 | L | L | H | H | EN | EN | EN | ALL GATES OPERATE IN SYNCHRONISM WITH CLOCK |
| 4 | — | — | H | L | L | H | L | ALL GATES ARE CLOSED |

SYNCHRONOUS DRAM WHOSE POWER CONSUMPTION IS MINIMIZED

BACKGROUND OF THE INVENTION

1. Field of the Invention

The present invention relates to a synchronous dynamic random access memory (synchronous DRAM or SDRAM) that operates synchronously with an externally-input signal. More particularly, this invention is concerned with a synchronous DRAM in which a signal path involved in one processing operation is divided into a plurality of stages of pipelines and the stages are operated in parallel in order to speed up processing.

2. Description of the Related Art

Normally, a signal is input externally to a semiconductor integrated circuit (including an LSI), a processing operation is carried out according to the input signal, and then an output signal is provided. It is therefore important to provide an output signal at a suitable timing relative to an external input signal. In the case of a general-purpose LSI, the timing is generally defined by the specifications for the LSI. Taking an SDRAM for instance, the timing of outputting data at a state-transition edge of an address signal and a data setup time required for writing data are specified together with a maximum frequency of the address signal.

In recent years, there has been an urgent need for an interface capable of operating quickly in an effort to cope with a high-frequency clock used by a CPU in a computer system or with high processing speeds of other various electronic circuits. For example, a CPU using a clock whose frequency is 100 MHz or higher has made its debut. An access speed or data transfer speed of a DRAM widely adopted as a main memory is one tenth of this clock frequency. Various novel types of DRAMs including an SDRAM have been proposed in an attempt to realize a data transfer speed of 100 MHz or higher.

An SDRAM inputs or outputs data synchronously with an externally-input high-frequency clock. SDRAMs can be of a type which includes a plurality of units capable of inputting or outputting data of a plurality of bits in parallel and in which an external interface is speeded up by converting the data of a plurality of bits into serial data, and a type in which internal operations are pipelined and the operations of pipelines are carried out in parallel in order to thus speed up processing. The present invention relates to a pipelined SDRAM. Herein, the pipelined SDRAM shall be referred to simply as an SDRAM.

The SDRAM can input or output data of consecutive addresses, that is, consecutive column addresses at a high speed. This operation mode is called a burst mode. For inputting or outputting data in the burst mode, a control signal indicating the burst mode is input. In addition, an address at which input or output is started and the lengths of data items to be input or output consecutively are input. In the SDRAM adopting pipelining, a signal path to be involved in input or output of data in the burst mode or, in reality, an output path along which data is read, is pipelined.

A processing circuit in an SDRAM to be involved in a read operation is divided into a plurality of stages along the flow of processing. The division circuits on the respective stages are called pipelines. A gate for controlling the timing of inputting data of a previous stage to a subsequent stage is interposed between pipelines of adjoining stages. An internal clock is supplied from a clock buffer to the pipelines and gates. The pipelines and gates are controlled according to the supplied internal clock.

In recent years, there has been a demand for a higher operation speed in the field of battery-driven portable computers. The use of an SDRAM as a memory device is demanded. In a battery-driven portable computer, it is very important to minimize power consumption. Specifically, the SDRAM must minimize a power consumption thereof while operating quickly.

A gate in the SDRAM is formed with a transfer gate composed of a p-channel transistor and n-channel transistor. The transfer gate repeats an on-off operation at a high speed and therefore suffers from a very high power consumption (charging current and discharged current). This leads to a large power consumption of a whole SDRAM. Even if the demand for fast operation is met, there arises a problem that the demand for low power consumption cannot be met.

SUMMARY OF THE INVENTION

The present invention attempts to solve the above problem. An object of the present invention is to minimize the power consumption of an SDRAM that operates quickly.

For a synchronous DRAM of the present invention, attention is paid to the fact that pipelines need not operate all the time and may not have to operate in some operation modes or operating states. When the pipelines need not operate, supply of an operation clock to gates is stopped in order to reduce the power consumptions of the gates. Accordingly, the synchronous DRAM of the present invention comprises an operation command judgment circuit for judging from the operating state of the synchronous DRAM whether or not the pipelines should be operated, and gate control circuits for giving control so that only when the operation command judgment circuit judges that the pipelines should be operated, an operation clock is supplied to the gates.

In an existing SDRAM, what is pipelined is mainly a signal path along which data is read. The present invention applies to a pipelining system according to which the signal path along which data is read is divided into pipelines, but is not limited to the pipelining. The present invention can naturally apply to a pipelining system according to which a signal path along which data is written is pipelined. When another signal path is pipelined, if pipelines may not have to operate, the present invention can be adapted to the signal path.

BRIEF DESCRIPTION OF THE DRAWINGS

The present invention will be more clearly understood from the description as set below with reference to the accompanying drawings, wherein:

FIG. 2 is a timing chart showing basic operations of the SDRAM;

FIG. 3 is a basic operation diagram of a pipelined SDRAM;

FIG. 5 is a diagram showing the pipelined configuration of an SDRAM in accordance with an embodiment of the present invention;

FIG. 11 is a table listing operating states in accordance with the embodiment.

DESCRIPTION OF THE PREFERRED EMBODIMENTS

Before proceeding to a detailed description of the preferred embodiments of the present invention, a prior art synchronous dynamic random access memory (SDRAM) will be described with reference to the accompanying drawings relating thereto for a clearer understanding of the differences between the prior art and the present invention.

Figure 1:
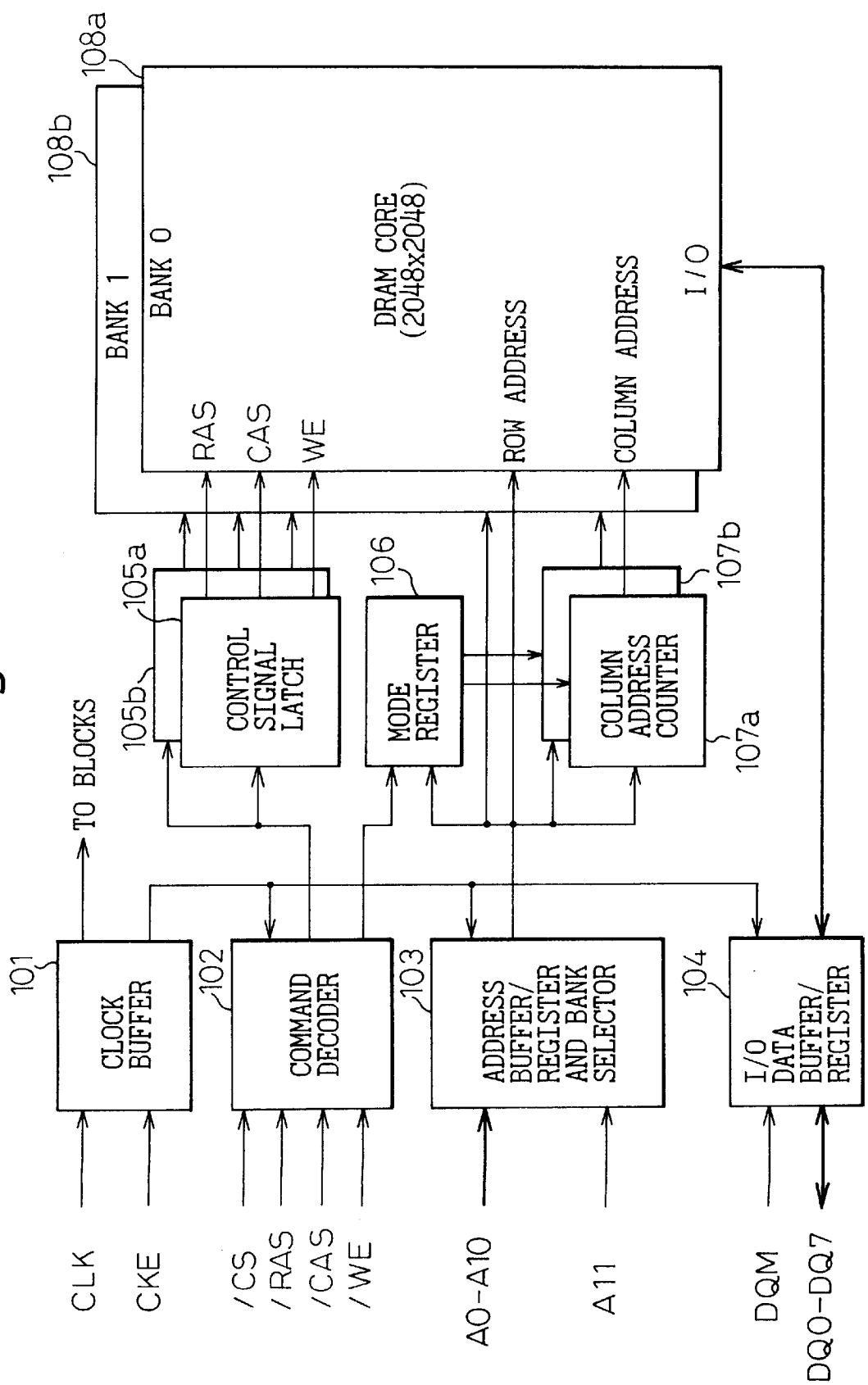
FIG. 1 is a block diagram showing the overall configuration of a synchronous DRAM (SDRAM)

FIG. 1 is a block diagram showing an example of the configuration of an SDRAM having a storage capacity of 16 MB, including two banks, and handling data 8 bits long.

The SDRAM comprises, in addition to core memories 108a and 108b that are general-purpose DRAMs, a clock buffer 101, a command decoder 102, an address buffer/register and bank selector (herein simply an address buffer) 103, an I/O data buffer/register 104, control signal latches 105a and 105b, a mode register 106, and column address counters 107a and 107b. Terminals /CS, /RAS, /CAS, and /WE are, unlike conventional ones, combined to input various kinds of commands, whereby an operation mode is determined. Various commands are interpreted by the command decoder. The respective circuits are controlled according to an operation mode. Signals /CS, /RAS, /CAS, and /WE are also input to the control signal latches 105a and 105b, and retained therein until a subsequent command is input.

An address signal is amplified by the address buffer 103, used as a load address of each bank, and also used as an initial value in the column address counters 107a and 107b. Signals read from the core memories 108a and 108b that are DRAMs are amplified by the I/O data buffer/register 104 and output synchronously with the rise of an external clock CLK that is input externally. The same operations are carried out for inputting signals. Input data is written in the I/O data buffer/register 104.

FIG. 2 is a diagram showing the timing of a general read operation performed on an SDRAM.

An external clock CLK is a signal supplied from a system in which the SDRAM is employed. Synchronously with the rise of the clock CLK, various commands, an address signal, and input data are fetched or output data is output.

Assuming that data is read from the SDRAM, an Active (ACT) command that is a combination of the command signals (signals /CS, /RAS, /CAS, and /WE) is input through a command terminal. A row address signal is input to an address terminal. When this command and row address is input, the SDRAM becomes active to select a word line indicated with the row address, to output cell information on the word line to bit lines, and to amplify the information using sense amplifiers.

After the operation time (rRCD) required in relation to the row address elapses, a Read command and column address are input. Data provided by a selected sense amplifier according to the column address is placed on a data bus, and amplified by a data bus amplifier. Data is then output from an output buffer through an output terminal DQ. The series of these operations is identical to that in a general-purpose DRAM. In the case of an SDRAM, a circuit operated in relation to a column address is pipelined, and read data is output consecutively during cycles. A cycle of data transfer is therefore equal to the cycle of an external clock.

Three kinds of access times are defined for an SDRAM with reference to the rise of a clock CLK. In FIG. 2, a time tRAC is a row address access time, a time tCAC is a column address access time, and a tAC is a clock access time. When the SDRAM is employed in a fast memory system, the times tRAC and tCAC that are the times required for obtaining data first after input of a command are significant. For improving the data transfer speed, the clock access time tAC is significant.

FIG. 3 is a block diagram for explaining pipelined operations to be carried out in an SDRAM during a read operation, showing three pipelines as an example.

A processing circuit in an SDRAM involved in a read operation is divided into a plurality of stages according to the flow of processing. Circuit divisions of stages are referred to as pipelines. A gate for controlling the timing of inputting data from a previous stage to a subsequent stage is located between adjoining pipelines. The clock buffer 101 generates internal clocks, which is supplied to the pipelines and gates, using an external clock CLK. The pipelines and gates are controlled according to the supplied internal clocks.

In this example, in pipeline-1, a column address buffer 116 amplifies an address signal, and sends a resultant address signal to a column decoder 118. Information provided by a sense amplifier 117 associated with the address and selected by the column decoder 118 is placed on a data bus, and the information on the data bus is amplified by a data bus amplifier 119. Pipeline-2 is composed of a high-impedance control circuit 120 and data length converting circuit 130. For example, when the length of external data is 16 bits, the length of internal data is set to 32 bits. In this case, data output from the data bus amplifier 119 is 32 bits long. The data length control circuit 130 converts the data of 32 bits long into data of 16 bits long, and outputs the data. The data length control circuit 130 can select a data length from among 4 bits, 8 bits, and 16 bits according to a control signal. The high-impedance control circuit 130 controls the impedance of an output. Pipeline-3 is formed with an output buffer 104. The output buffer 104 adjusts output timing. If the circuits in any pipeline complete an operation within a time equal to a clock cycle, data can be sent in a relayed fashion by opening or closing gates 121 and 122, each of which is interposed between adjoining pipelines, synchronously with an external clock CLK. Consequently, the operations in the pipelines are carried out in parallel, and data items are output consecutively through an output terminal synchronously with the external clock CLK.

As shown in FIG. 3, in the conventional SDRAM, a signal path to be involved in input or output of data in a burst mode is pipelined, and the gates 121 and 122 are interposed among pipelines. The gates 121 and 122 are each formed as a transfer gate composed of a p-channel transistor and n-channel transistor. A high-frequency signal having the same frequency as a clock is applied to the gates 121 and 122. Since a transfer gate repeats an on-off operation at a high speed, the power consumption (charging current and discharged current) of the gate is very large.

Figure 4A:
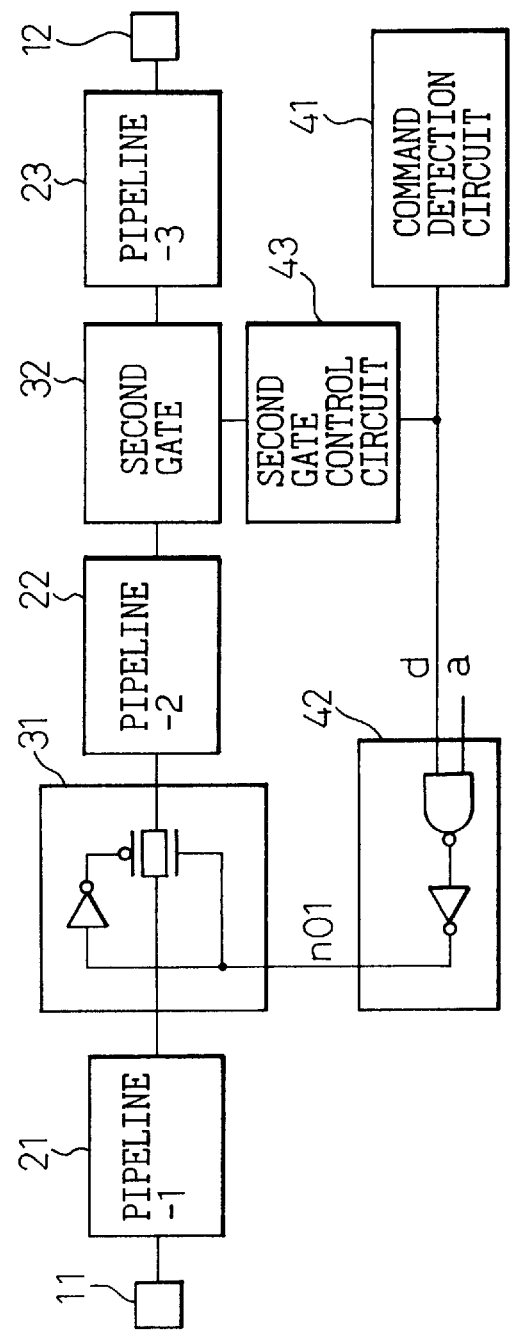
FIG. 4A is a diagram showing the basic configuration of an SDRAM of the present invention.
Figure 4B:
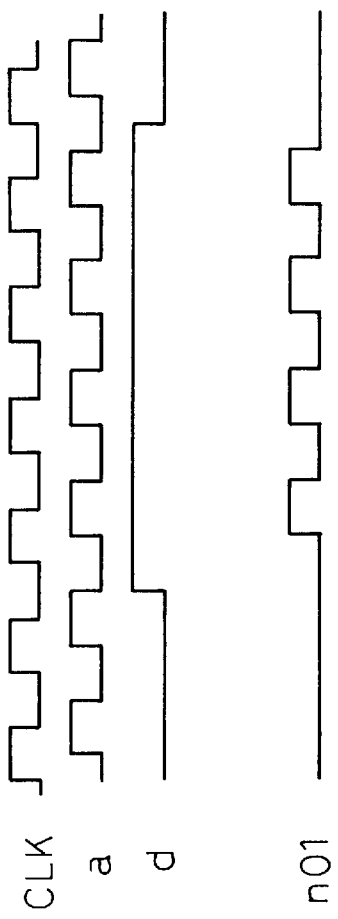
FIG. 4B is a timing chart showing operation signals.

FIG. 4A is a block diagram showing the basic configuration of a synchronous DRAM of the present invention, and FIG. 4B is a timing chart showing operating signals.

As illustrated, the synchronous DRAM of the present invention is a synchronous DRAM that operates synchronously with an externally-input clock CLK. The synchronous DRAM comprises a clock buffer for generating an operation clock n01 using an external clock, a plurality of stages of pipelines 21, 22, and 23, and gates 31 and 32 that are interposed among the pipelines and operate according to the operation clock so as to restrict the timing of inputting an output of a previous stage to a subsequent stage. The synchronous DRAM, in which at least part of consecutive operations are pipelined, further comprises an operation command judgment circuit 41 for determining from the operating state of the synchronous DRAM whether or not the pipelines should be operated, and gate control circuits 42 and 43 for giving control so that only when the operation command judgment circuit 41 determines that the pipelines should be operated, is the operation clock applied to the gates.

As shown in FIG. 4B, an operation clock a has the same frequency as an external clock CLK. In the prior art, the operation clock is always applied to a transfer gate forming a gate. However, in the present invention, the operation command judgment circuit 41 determines whether or not the pipelines should be operated. If the pipelines should be operated, for example, a signal d is driven high. If the pipelines need not be operated, the signal d is driven low. The first gate control circuit 42 includes a NAND gate that inputs an operation clock a and signal d. When the signal d is low, a clock n01 is fixed to low. A transfer gate forming the gate 31 is cut off and consumes almost no power.

For stopping supply of an operation clock to the gate 31 or 32, the gate may be brought to a conducting state.

An embodiment of the present invention will be described below. As shown in FIGS. 4A and 4B, the present invention is characterized in that gate control circuits dependent on an output of an operation command judgment circuit are included in addition to the components of the conventional SDRAM. As for the other parts, the components of the conventional SDRAM can be used as they are. Only the parts of gates, an operation command judgment circuit, and gate control circuits will be described below. As mentioned above, as far as an existing SDRAM is concerned, what is pipelined is mainly a signal path along which data is read. An embodiment in which the present invention is adapted to pipelines of a signal path along which data is read will be described below.

FIG. 5 is a diagram showing the pipelined configuration of a signal path, along which data is read, in an SDRAM of an embodiment of the present invention. As illustrated, pipeline-1 consists of an input terminal (including a plurality of input terminals) through which a column address signal is input, a column address buffer 116, a command decoder 102, a core memory 108 that is a DRAM (including sense amplifiers), and a data bus amplifier 119. Pipeline-2 consists of a bit length control circuit 130 for converting an output of the data bus amplifier 119, which is 32 bits long, into data having a required data length, and a high-impedance control circuit 120. Pipeline-3 is formed with an output circuit 232 for giving control so that data to be output from the high-impedance control circuit 120 is output synchronously with an external clock. A first gate 31 is interposed between pipeline-1 and pipeline-2. The first gate 31 is controlled by a first gate control circuit 421. A second gate 32 is interposed between pipeline-2 and pipeline-3, and controlled by a second gate control circuit 422. Also included is a gate stoppage signal generation circuit 411 for determining from signals sent from the command decoder 102 and a column address counter whether or not the pipelines should be operated and for outputting a gate stoppage signal pz according to the result of the determination.

As mentioned above, the pipelined configuration shown in FIG. 5 includes, in addition to the conventional components shown in FIG. 3, the gate stoppage signal generation circuit 411 and the first and second gate control circuits 421 and 422. Strictly speaking, the first and second gate control circuits 421 and 422 are included even in the conventional circuitry in order to generate a signal used to control an associated gate. In this embodiment, the first and second control circuits 421 and 422 are provided with the ability to stop generation of an operation clock to be applied to each gate according to a gate stoppage signal pz output from the gate stoppage signal generation circuit 411. In this embodiment, state 1 in which both the first gate 31 and second gate 32 are conducting, state 2 in which the first gate 31 is conducting and the second gate 32 operates synchronously with a clock, state 3 in which both the first gate 31 and second gate 32 operate synchronously with the clock, and state 4 in which both the first gate 31 and second gate 32 are cut off can be attained according to an operation mode. State 1 is a state attained when, for example, operations are not pipelined, or when the SDRAM operates like an ordinary DRAM. State 2 is a state attained when a clock having a slightly low frequency is used or when the first gate is conducting so as to construct a dual-stage pipelined configuration where pipeline-1 and pipeline-2 operate as a first-stage pipeline and where pipeline-3 operates as a second-stage pipeline. State 3 is a state attained with the illustrated triple-stage pipelined configuration. State 4 is attained when the pipelines need not be operated.

Figure 6:
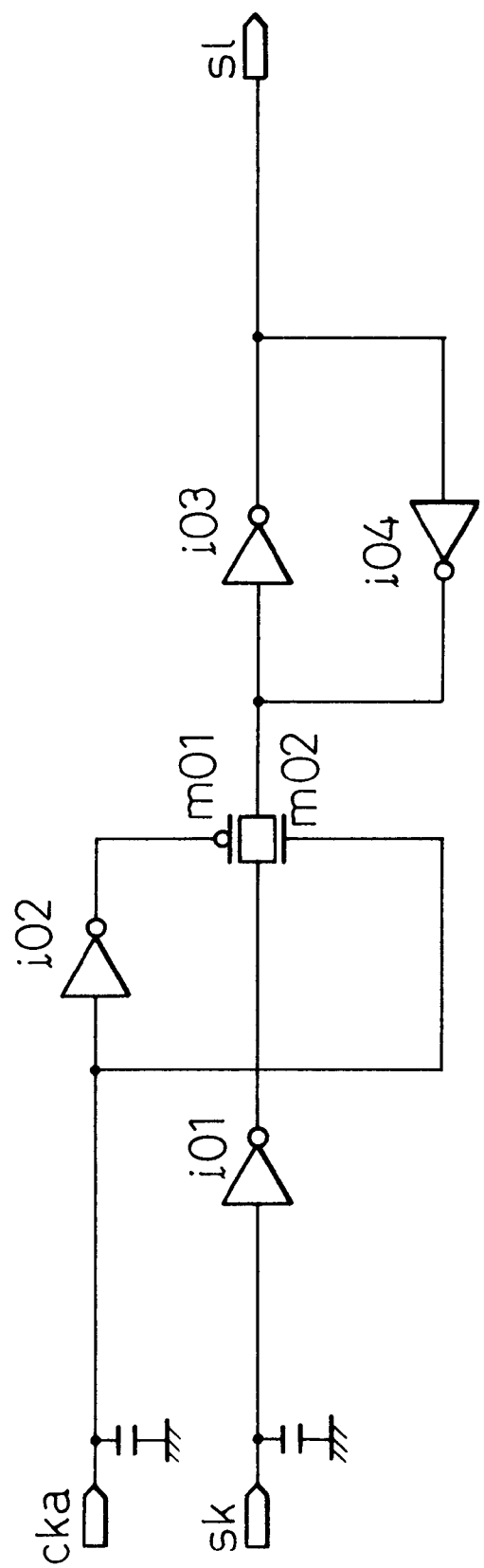
FIG. 6 is a diagram showing the circuitry of a first gate of the embodiment.

FIG. 6 is a diagram showing the circuitry of the first gate 31. As shown in FIG. 6, an output sk of the data amplifier 119 is input to a transfer gate composed of a p-channel transistor m01 and n-channel transistor m02 via an inverter i01. A flip-flop composed of inverters i03 and i04 is connected to an output terminal of the transfer gate. The flip-flop outputs an output sl to the subsequent stage. A first operation clock cka is applied to the gate of the n-channel transistor m02, and a signal produced by the inverter i02 for inverting the operation clock cka is applied to the gate of the p-channel transistor m01. The transfer gate is conducting when the operation clock cka is high, and is cut off when the operation clock cka is low. When the operation clock cka alternates as does an external clock, the transfer gate is alternately conducting and cut off at intervals of the cycle of the operation clock cka. In the conducting state, the transfer gate allows the inverted output sk to pass, and sets the flip-flop to a state enabling handling of the output sk. In the cutoff state, the transfer gate retains the state of the flip-flop to prevent the flip-flop from changing the state thereof responsively to the state transition of the output sk. This makes it possible to send an output of pipeline-1 to pipeline-2 synchronously with the operation clock cka. FIG. 6 shows the circuitry of a gate for handling one bit. The same number of gates each having the circuitry shown in FIG. 6 as the number of bits defining a data length are included.

Figure 7:
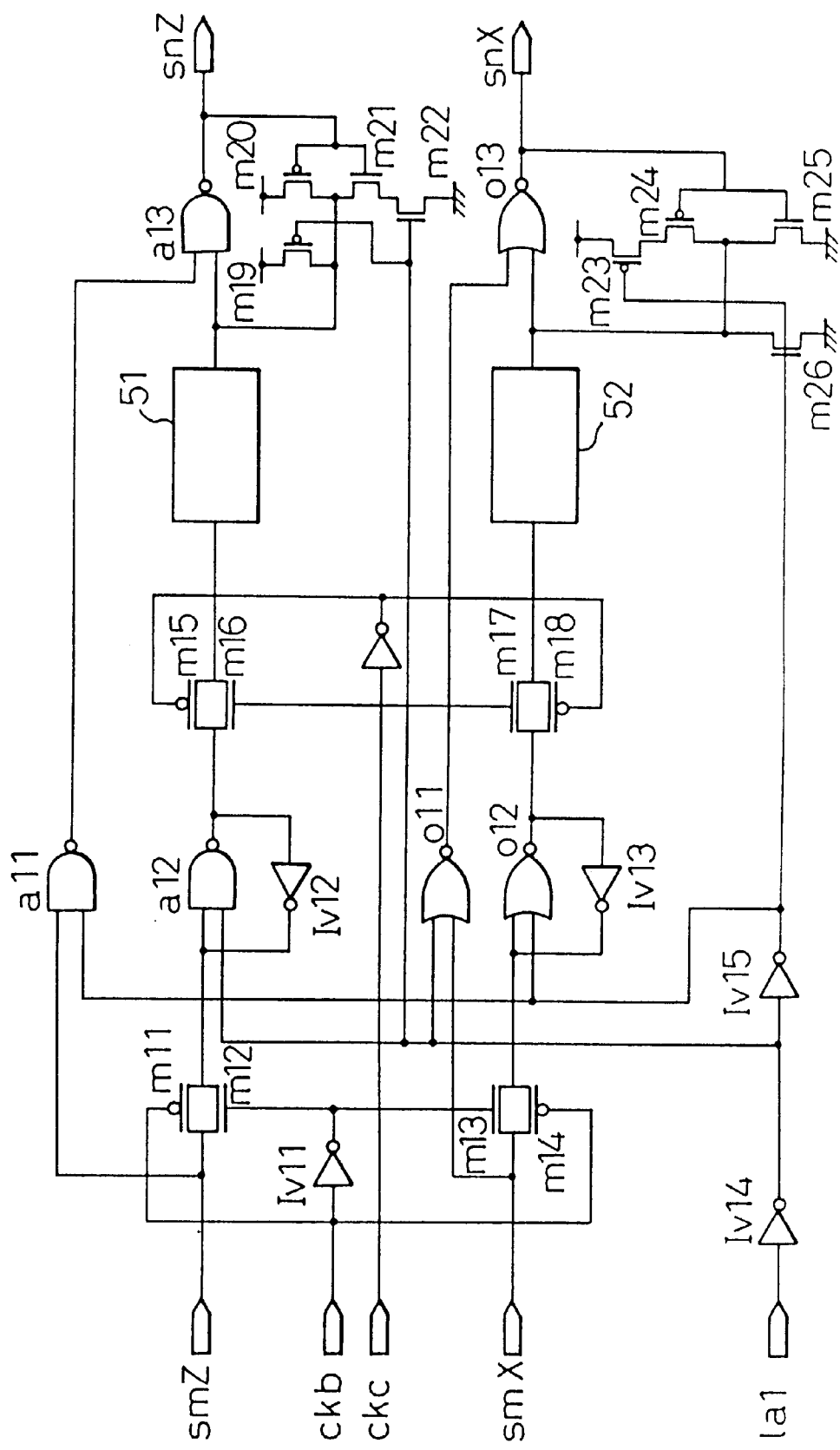
FIG. 7 is a diagram showing the circuitry of a second gate of the embodiment.

FIG. 7 is a diagram showing the circuitry of the second gate 32. The high-impedance control circuit 120 converts an output of the data bus amplifier 119, which has passed through the first gate 31, into complementary signals, and outputs the complementary signals. In FIG. 7, signals smz and smx are the complementary signals and input to a transfer gate composed of a p-channel transistor m11 and n-channel transistor m12 and to a transfer gate composed of an n-channel transistor m13 and p-channel transistor m14.

The transfer gates are controlled with a signal ckb. When the signal ckb is high, the transfer gates are cut off. When the signal ckb is low, the transfer gates are conducting. With input of an operation clock, the transfer gates repeat a state change to be cut off and conducting. On a stage succeeding the transfer gates, there are a latch composed of a NAND gate a12 and inverter Iv12 and a latch composed of a NOR gate o12 and inverter Iv13. A transfer gate composed of a p-channel transistor m15 and n-channel transistor m16 and a transfer gate composed of an n-channel transistor m17 and p-channel transistor m18 are included on a succeeding stage. The transfer gates are controlled with a signal ckc. The transfer gates are thus included on two stages in order to adjust the timing of transmitting an output of pipeline-2 to pipeline-3. Complementary signals of an output of pipeline-2 are latched temporarily by the latches after passing through the preceding transfer gates. When the succeeding transfer gates conduct, the signals are transmitted to pipeline-3. The signals passing through the succeeding transfer gates pass through delay circuits 51 and 52 where the signals have the timing thereof adjusted, and are then input to NAND gates a13 and o13. A NAND gate a11 and NOR gate o12 serve as bypasses causing the input signals smz and smx to be input directly to the NAND gate a13 and NOR gate o13 in state 1 without passing through the above paths. A signal la1 is a control signal used to give control so that the bypasses are validated in state 1 and the paths including the transfer gates are validated in any other state. The signal la1 is input to the gates a11 and 011 and the gates a12 and 012. A portion starting with a transistor m19 and ending with a transistor m26 is a circuit for fixing the outputs of the delay circuits 51 and 52 to high and low respectively in state 1.

Figure 8:
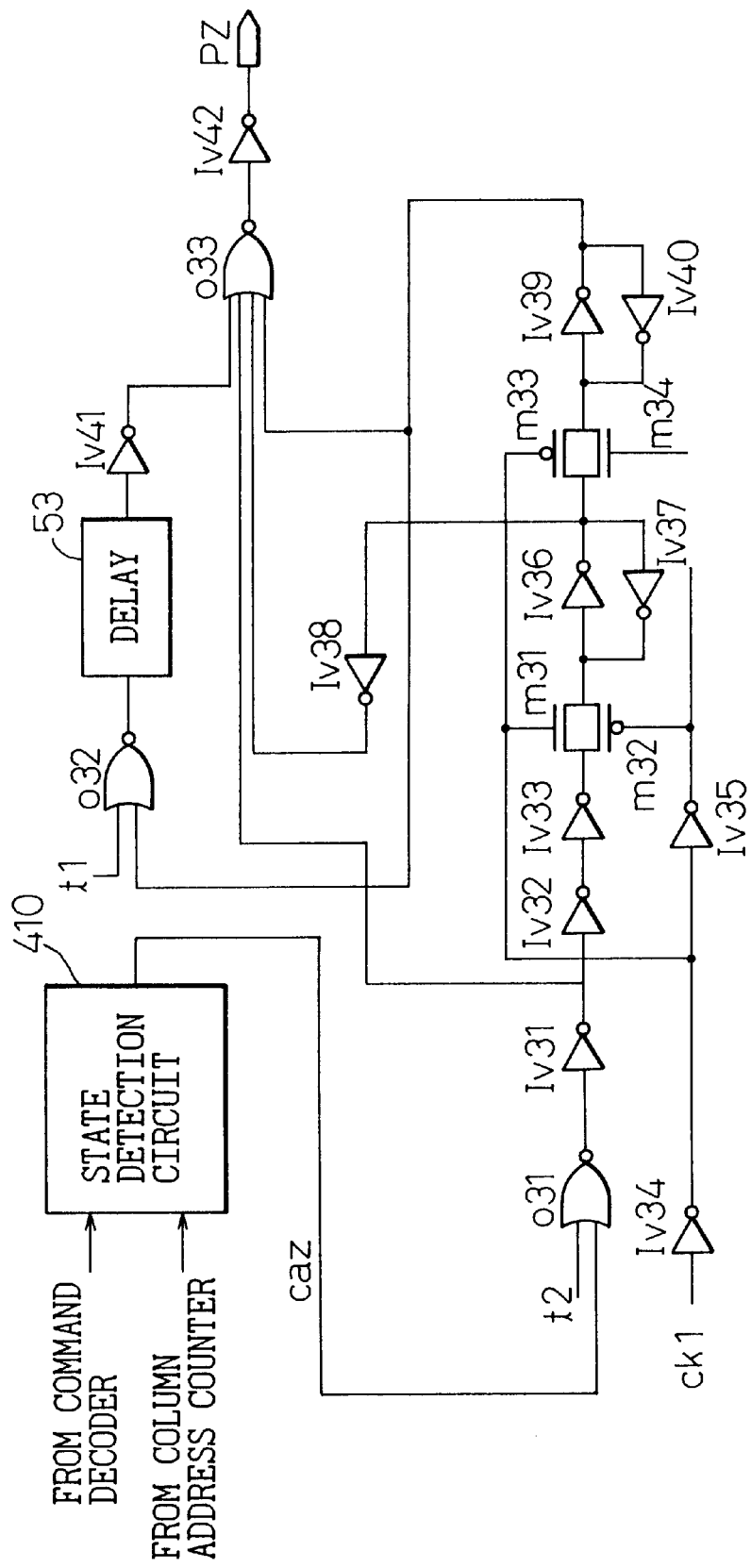
FIG. 8 is a diagram showing the circuitry of a gate stoppage signal generation circuit of the embodiment.

FIG. 8 is a diagram showing the circuitry of the gate stoppage signal generation circuit. A state detection circuit 410 is a logic circuit for inputting a signal from the command decoder 102 and signals from column address counters 107a and 107b. It is determined from these signals whether or not a processing operation to be carried out is a read operation. When the first and second gates 31 and 32 must be operated, an output signal caz is driven low. When the first and second gates need not be operated, the output signal caz is driven high. The signal caz goes high when the pipelined operations are terminated on the first stage. Since the operations are pipelined, when the operations of two more stages are carried out, all the pipelined operations are completed. Inverters Iv31 to Iv42, NOR gates o31 to o33, two transfer gates, and a delay circuit 53 constitute a circuit for generating a gate stoppage signal pz produced by extending the cycle of the signal caz by the cycles of two clocks. The gate stoppage signal pz goes low when the gates are stopped operating to be cut off, and goes high in any other state. Signals t1 and t2 are signals causing the gate stoppage signal pz to go high during a test. A clock ck1 is used to operate the transfer gates.

Figure 9:
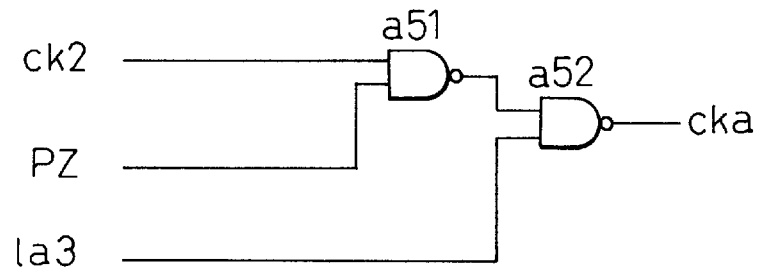
FIG. 9 is a diagram showing the circuitry of a first gate control circuit of the embodiment.

FIG. 9 is a diagram showing the circuitry of the first gate control circuit 421. As illustrated, the circuit is composed of two NAND gates a51 and a52. An operation clock ck2 has the same frequency as an external clock and has the phase thereof adjusted so that the operation clock can cause the first gate to operate. A signal la3 is a control signal that is driven low in order to cause the first gate 31 to conduct, and that is driven high in any other state. When the gate stoppage signal pz is driven low, a signal cka goes low. The state of the first gate 31 is fixed.

Figure 10:
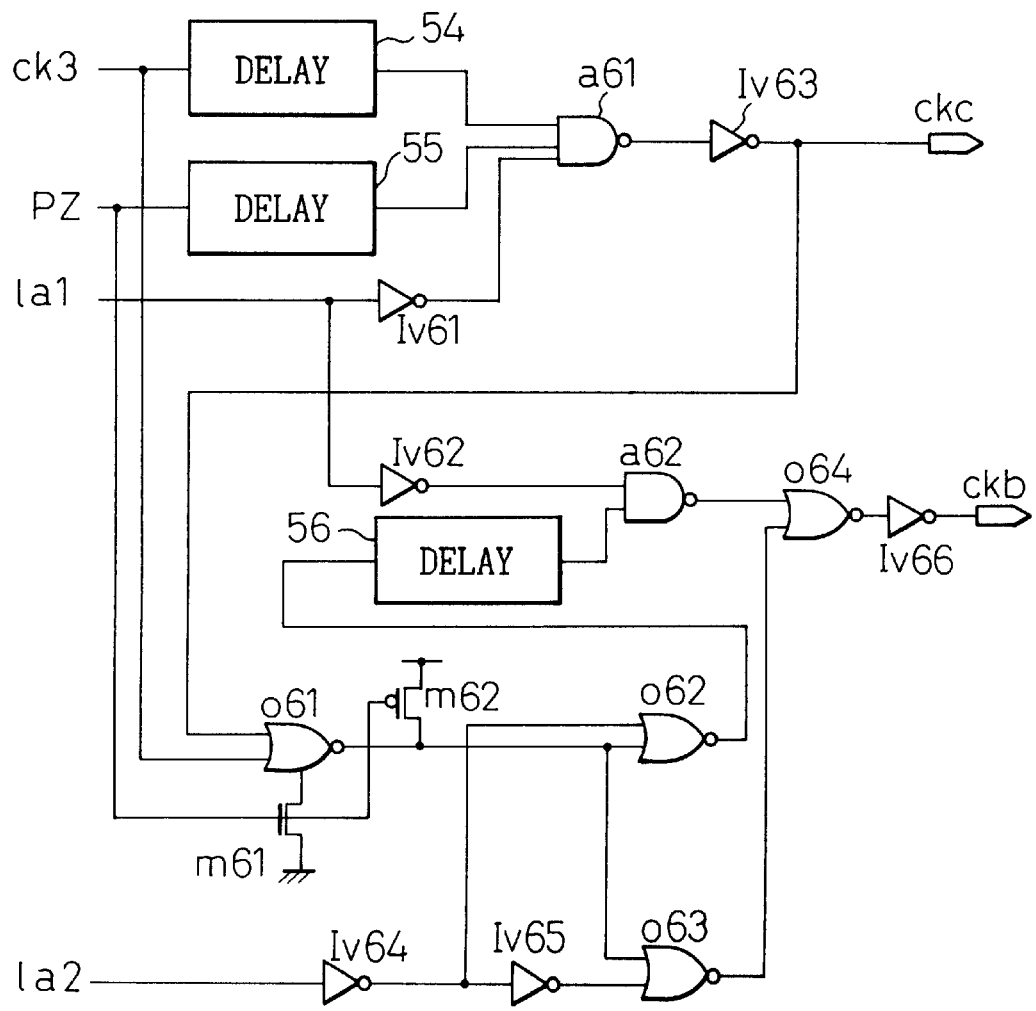
FIG. 10 is a diagram showing the circuitry of a second gate control circuit of the embodiment.

FIG. 10 is a diagram showing the circuitry of the second gate control circuit 422. A signal ck3 has the same frequency as an external clock. This circuit produces gate control signals ckb and ckc, which are mutually difference in pulse duration and are out of phase, using the signal ck3. A signal la1 is a control signal shown in FIG. 7. A signal la2 is also a control signal. Even in this circuit, when the gate stoppage signal pz is driven low, the signal ckb goes high and the signal ckc goes low. The second gate 32 is then cut off.

FIG. 11 is a table listing the logical states of the gate control signals cka, ckb, and ckc in relation to the logical states of the control signals la1, la2, and la3 and of the gate stoppage signal pz in this embodiment. As illustrated, in state 1, the transfer gate in the first gate 31 which is composed of the transistors m01 and m02, and all the four transfer gates in the second gate 32 which are composed of the transistors m11 and m12, m13 and m14, m15 and m16, and m17 and m18 are conducting. In state 2, the transfer gate in the first gate 31 is conducting, but the four transfer gates in the second gate 32 repeat a state change to be conducting and cut off according to operation clocks. In state 3, the transfer gate in the first gate 31 and the four transfer gates in the second gate 32 repeat the state change to be conducting and cut off according to the operation clocks. In states 1, 2, and 3, the gate stoppage signal pz is high. In state 4 in which the gate stoppage signal pz is driven low, the transfer gate in the first gate 31 and the four transfer gates in the second gates are all cut off. As described in conjunction with FIG. 8, unless a read operation is carried out and both the first and second gates 31 and 32 must be operated, that is, when the first and second gates 31 and 32 need not be operated, the gate stoppage signal pz goes low. The first and second gates 31 and 32 will not be operated without reason. The power consumptions of the first and second gates 31 and 32 can be minimized.

As described above, according to the present invention, the power consumption required by the pipelining system that is intended to improve an operation speed is minimized. This results in a synchronous DRAM that can operate quickly and requires only a small amount of power.

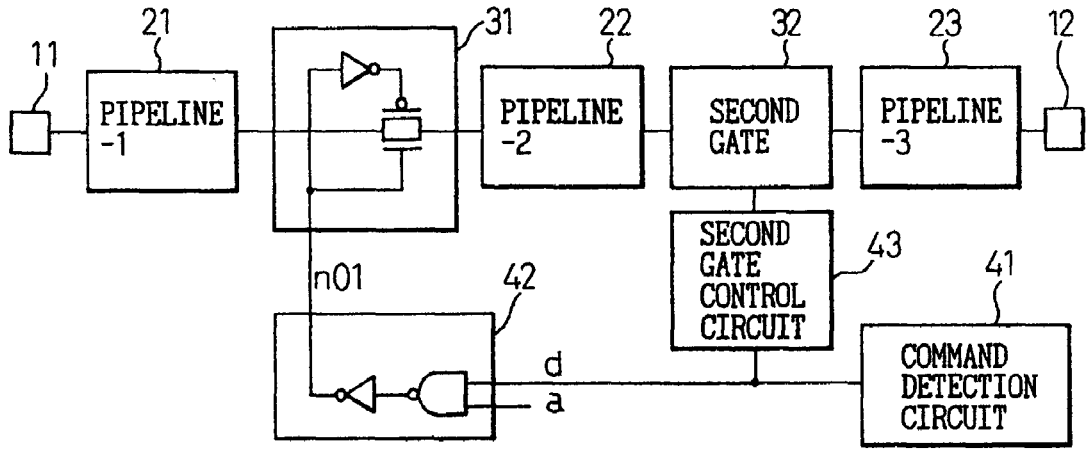

What is claimed is:

1. A synchronous DRAM operating synchronously with an external clock, comprising:

a clock buffer, for receiving the external clock, and for generating an internal clock;

a plurality of pipelines;

a plurality of gates, interposed among said pipelines;

an operation mode judgement circuit for determining an operation mode in response to a command input and for outputting a mode signal; and a gate control circuit, receiving the mode signal, for providing said internal clock to the gates when said operation mode is a first operation mode, and for not providing said internal clock to the gates when said operation mode is a second operation mode.

2. The synchronous DRAM according to claim 1, wherein said gates are cut off in said second operation mode.

3. The synchronous DRAM according to claim 1, wherein a signal path for reading data stored in a memory cell to an output terminal is divided into said plurality of pipelines.

4. The synchronous DRAM according to claim 1, wherein said first operation mode is a read operation mode.

5. A synchronous DRAM receiving an external clock, comprising:

a clock buffer, for receiving the external clock, and for generating an internal clock;

a plurality of stages of signal paths for reading data stored in a memory cell to an output terminal;

a plurality of transfer gates disposed between neighboring two stages of said signal paths;

an operation mode judgement circuit for detecting an operation mode in response to a command input, and for outputting a mode signal; and a gate control circuit, receiving the operation mode signal, for providing said internal clock to the plurality of transfer gates when said operation mode is a read operation mode, and for not providing said internal clock to the plurality of transfer gates when said operation mode is not said read operation mode.

6. The synchronous DRAM according to claim 5, wherein:

said plurality of stages of signal paths comprises first, second and third stages;

said plurality of transfer gates include first and second transfer gates;

the first transfer gate is disposed between the first and second stages, the second transfer gate is disposed between the second and third stages, said clock buffer circuit outputs first and second internal clocks as the internal clock, said gate control circuit comprises first and second gate control circuit portions, the first gate control circuit portion receives said first internal clock and said operation mode signal and does not provide said first internal clock to said first transfer gate when said operation mode is not said read operation mode, and the second gate control circuit portion receives said second internal clock and said operation mode signal and does not provide said second internal clock to said second transfer gate when said operation mode is not said read operation mode.

* * * * *

UNITED STATES PATENT AND TRADEMARK OFFICE
CERTIFICATE OF CORRECTION

| | | |
|---|---|---|
| PATENT NO. | : 6,014,339 | |
| APPLICATION NO. | : 08/920888 | |
| DATED | : January 11, 2000 | |
| INVENTOR(S) | : Hiroyuki Kobayashi et al. | |

It is certified that error appears in the above-identified patent and that said Letters Patent is hereby corrected as shown below:

IN THE CLAIMS:

Please add the following new claims:

Col. 10 lines 19-21
-- 7. The synchronous DRAM according to claim 1, wherein each of said plurality of gates comprising a transmission gate composed of a pair of a P-channel MOS transistor and an N-channel MOS transistor. --

Col. 10 lines 22-23
-- 8. The synchronous DRAM according to claim 5, wherein a latch circuit is arranged between selected two of said transmission gates. --

Col. 11 lines 1-4
-- 9. The synchronous DRAM according to claim 1, wherein said plurality of pipelines including three stages isolated by one or more transmission gates of said plurality of gates, each of said transmission gates comprising a pair of a P-channel MOS transistor and an N-channel MOS transistor. --

Col. 11 lines 5-9
-- 10. The synchronous DRAM according to claim 5, further comprising: a command decoder, receiving said command input, for outputting a decoded command signal, wherein said operation mode judgement circuit includes a state detection circuit responsive to said decoded command signal and an address output signal from a column address counter to output said operation mode signal. --

Signed and Sealed this
Seventeenth Day of May, 2011

David J. Kappos
*Director of the United States Patent and Trademark Office*

Col. 11 lines 10-12
--11. The synchronous DRAM according to claim 10, wherein said operation mode judgement circuit further includes a delay circuit for delaying an output signal from said state detection circuit to produce said operation mode signal. --

Col. 11 lines 13-14
-- 12. The synchronous DRAM according to claim 11, wherein said delay circuit is controlled by a clock signal. --

Col. 11 lines 17-18
--13. The synchronous DRAM according to claim 11, wherein a delay time in said delay circuit is adjusted such that in said read operation mode, said gate control circuit stops providing said plurality of transfer gates with said internal clock after operations in all stages of said signal paths are completed. --

Col. 11 lines 19-22
-- 14. The synchronous DRAM according to claim 6, wherein said first gate control circuit portion further receives a timing control signal, and in response to said timing control signal said first gate control circuit portion outputs a constant voltage in place of said first internal clock, to turn on the first transfer gate in said read operation mode. --

Col. 11 lines 23-24
-- 15. The synchronous DRAM according to claim 1, wherein a signal path for writing data to a memory cell is divided into said plurality of pipelines. --

Col. 11 lines 25-27
-- 16. The synchronous DRAM according to claim 1, wherein in the first operation mode, said gate control circuit provides said internal clock to a part of the plurality of gates. --

UNITED STATES PATENT AND TRADEMARK OFFICE
CERTIFICATE OF CORRECTION

PATENT NO. : 6,014,339  
APPLICATION NO. : 08/920888  
DATED : January 11, 2000  
INVENTOR(S) : Hiroyuki Kobayashi et al.

Page 1 of 3

It is certified that error appears in the above-identified patent and that said Letters Patent is hereby corrected as shown below:

Delete the title page and substitute therefore the attached title page showing the corrected number of claims in patent.

IN THE CLAIMS:

Please add the following new claims:

Col. 10 lines 19-21
-- 7. The synchronous DRAM according to claim 1, wherein each of said plurality of gates comprising a transmission gate composed of a pair of a P-channel MOS transistor and an N-channel MOS transistor. --

Col. 10 lines 22-23
-- 8. The synchronous DRAM according to claim 5, wherein a latch circuit is arranged between selected two of said transmission gates. --

Col. 11 lines 1-4
-- 9. The synchronous DRAM according to claim 1, wherein said plurality of pipelines including three stages isolated by one or more transmission gates of said plurality of gates, each of said transmission gates comprising a pair of a P-channel MOS transistor and an N-channel MOS transistor. --

This certificate supersedes the Certificate of Correction issued May 17, 2011.

Signed and Sealed this  
Twenty-first Day of June, 2011

David J. Kappos  
*Director of the United States Patent and Trademark Office*

Col. 11 lines 5-9
-- 10. The synchronous DRAM according to claim 5, further comprising: a command decoder, receiving said command input, for outputting a decoded command signal, wherein said operation mode judgement circuit includes a state detection circuit responsive to said decoded command signal and an address output signal from a column address counter to output said operation mode signal. --

Col. 11 lines 10-12
-- 11. The synchronous DRAM according to claim 10, wherein said operation mode judgement circuit further includes a delay circuit for delaying an output signal from said state detection circuit to produce said operation mode signal. --

Col. 11 lines 13-14
-- 12. The synchronous DRAM according to claim 11, wherein said delay circuit is controlled by a clock signal. --

Col. 11 lines 17-18
-- 13. The synchronous DRAM according to claim 11, wherein a delay time in said delay circuit is adjusted such that in said read operation mode, said gate control circuit stops providing said plurality of transfer gates with said internal clock after operations in all stages of said signal paths are completed. --

Col. 11 lines 19-22
-- 14. The synchronous DRAM according to claim 6, wherein said first gate control circuit portion further receives a timing control signal, and in response to said timing control signal said first gate control circuit portion outputs a constant voltage in place of said first internal clock, to turn on the first transfer gate in said read operation mode. --

Col. 11 lines 23-24
-- 15. The synchronous DRAM according to claim 1, wherein a signal path for writing data to a memory cell is divided into said plurality of pipelines. --

Col. 11 lines 25-27
-- 16. The synchronous DRAM according to claim 1, wherein in the first operation mode, said gate control circuit provides said internal clock to a part of the plurality of gates. --

United States Patent [19]
Kobayashi et al.

[11] Patent Number: 6,014,339
[45] Date of Patent: Jan. 11, 2000

[54] SYNCHRONOUS DRAM WHOSE POWER CONSUMPTION IS MINIMIZED

[75] Inventors: Hiroyuki Kobayashi; Tatsuya Kanda, both of Kawasaki, Japan

[73] Assignee: Fujitsu Limited, Kanagawa, Japan

[21] Appl. No.: 08/920,888

[22] Filed: Aug. 29, 1997

[30] Foreign Application Priority Data

Apr. 3, 1997 [JP] Japan ................................. 9-085284

[51] Int. Cl.$^7$ ..................................... G11C 8/00
[52] U.S. Cl. ........................... 365/233; 365/191
[58] Field of Search ....................... 365/233, 191

[56] References Cited

U.S. PATENT DOCUMENTS 5,384,737 1/1995 Childs et al. ............. 365/189.05
5,550,781 8/1996 Takai ........................... 365/233

*Primary Examiner*—David Nelms
*Assistant Examiner*—Hoai V. Ho
*Attorney, Agent, or Firm*—Nikaido Marmelstein Murray & Oram LLP

[57] ABSTRACT

An SDRAM that can operate quickly and requires a small amount of power. The SDRAM is a synchronous DRAM operating synchronously with an externally-input clock and has a clock buffer for generating an operation clock using the external clock, a plurality of pipelines, and gates interposed among the pipelines, operating according to the operation clock so as to restrict the timing of inputting an output of a previous stage to a subsequent stage. The synchronous DRAM, in which at least part of operations to be carried out consecutively are pipelined, further has an operation command judgment circuit for determining from the operating state of the synchronous DRAM whether or not the pipelines should be operated, and gate control circuits for giving control so that only when the operation command judgment circuit determines that the pipelines should be operated, is the operation clock supplied to the gates.

16 Claims, 10 Drawing Sheets